(12) United States Patent
Hansell et al.

(10) Patent No.: US 6,559,922 B2
(45) Date of Patent: May 6, 2003

(54) METHOD AND APPARATUS FOR A NON-CONTACT SCAVENGING SEAL

(76) Inventors: Eric C. Hansell, 4 Cambridge Cir., New Milford, CT (US) 06776; Jose V. Herrera, 416 Knowlton St., Stratford, CT (US) 06615; Richard L. Huse, 6 Devon Ave., Norwalk, CT (US) 06850; Jorge S. Ivaldi, 2060 Huntington Turnpike, Trumbull, CT (US) 06611; Stephen G. Krehley, 40 Tashua La., Trumbull, CT (US) 06611; Thomas P. Shamaly, 19 Spoke Dr., Shelton, CT (US) 06484

( * ) Notice: Subject to any disclaimer, the term of this patent is extended or adjusted under 35 U.S.C. 154(b) by 0 days.

(21) Appl. No.: 09/846,386

(22) Filed: May 2, 2001

(65) Prior Publication Data

US 2001/0038442 A1 Nov. 8, 2001

Related U.S. Application Data

(60) Provisional application No. 60/201,704, filed on May 3, 2000.

(51) Int. Cl.$^7$ .............................................. G03B 27/52
(52) U.S. Cl. ........................................................ 355/30
(58) Field of Search ............................. 355/30, 77, 133

(56) References Cited

U.S. PATENT DOCUMENTS

| | | | |
|---|---|---|---|
| 4,185,202 A | * | 1/1980 | Dean et al. ................... 378/34 |
| 4,837,443 A | * | 6/1989 | Young et al. .......... 250/440.11 |
| 5,412,981 A | | 5/1995 | Myers et al. .................. 73/119 |
| 5,973,764 A | * | 10/1999 | McCullough et al. ......... 355/30 |

FOREIGN PATENT DOCUMENTS

| | | | |
|---|---|---|---|
| EP | 0 242 178 A | 10/1987 | ............. H01S/3/23 |
| EP | 0 242 178 | * 10/1987 | ............. H01S/3/23 |
| EP | 0 532 968 A | 3/1993 | ............. G03F/7/20 |
| EP | 0 886 184 A2 | 12/1998 | ............. G03F/7/20 |
| EP | 0 957 402 A | 11/1999 | ............. G03F/7/20 |
| EP | 1 098 225 A2 | 5/2001 | ............. G03F/7/20 |

OTHER PUBLICATIONS

Copy of International Search Report, Application No. PCT/US01/14067, issued Oct. 11, 2001, 3 pages.

* cited by examiner

Primary Examiner—Russell Adams
Assistant Examiner—D. Ben Esplin
(74) Attorney, Agent, or Firm—Sterne, Kessler, Goldstein & Fox, P.L.L.C.

(57) ABSTRACT

A method and apparatus for providing a purged optical path between an optical source surface and an optical target surface and for permitting relative movement between the optical source surface and the optical target surface is described. The apparatus includes a body, a central cavity, at least one gas supply bore, and at least one gas removal bore. The body defines first and second opposing surfaces. The first opposing surface is configured for positioning closely adjacent to the optical target surface. The second opposing surface is configured to mate with the optical source surface. The central cavity is formed in the body for passing light through the body, the central cavity being open at the first and second opposing surfaces. The at least one gas supply bore is formed in the body for suppling a flow of a purge gas to the central cavity. The at least one gas removal bore is formed in the body at the first opposing surface to remove gas from a gap formed between the first opposing surface and the optical target surface.

13 Claims, 6 Drawing Sheets

METHOD AND APPARATUS FOR A NON-CONTACT SCAVENGING SEAL

This application claims the benefit of U.S. Provisional Application No. 60/201,704, filed May 3, 2000.

BACKGROUND OF THE INVENTION

1. Field of the Invention

The present invention is generally related to photolithography systems and, more particularly, to maintaining a purged optical path in a photolithography system with a non-contact scavenging gas seal.

2. Related Art

In the fabrication of integrated circuits, photolithographic and projection printing techniques are used. In photolithography, an image contained on a reticle is projected through an optics system onto a surface of a semiconductor wafer. The semiconductor wafer surface is coated with photosensitive resist so that an image is etched thereon.

Generally, a photolithography system is located in an ambient atmosphere, clean room environment. However, some wavelengths of light used in photolithography are sensitive to absorption by atmospheric oxygen. Hence, when such oxygen-sensitive light wavelengths are used in photolithography, they must be transmitted through an oxygen-purged atmosphere.

In some situations, the ambient atmosphere of the clean room cannot be purged of oxygen because this causes problems with maintainability and service. Stages of the lithography system controlling motion of an illuminating laser across a semiconductor wafer surface may be controlled by a laser interferometer. The laser interferometer is sensitive to the index of refraction of light of air, which may be affected by random index of refraction fluctuation induced by ambient nitrogen concentration fluctuation. Hence, in some situations, the nitrogen-purge environment must be restricted as much as possible to the lithography system's optical path.

Sealing the optical path, however, is difficult because the optical path may have multiple points needing to be sealed from the ambient environment.

Furthermore, a seal may be required between surfaces in the optical path that move relative to each other. For instance, the projection optics may move in relation to the semiconductor wafer surface when projecting light wavelengths across different areas of the semiconductor wafer surface. The projection optics may also move in relation to the reticle when different areas of the reticle are being imaged. What is needed is a method and apparatus for maintaining an oxygen-purged optical path in a lithography system.

SUMMARY OF THE INVENTION

The invention is directed to a method and apparatus for a non-contact scavenging gas seal. The invention is further directed to method and apparatus for providing a purged optical path between an optical source surface and an optical target surface and for permitting relative movement between the optical source surface and the optical target surface. The non-contact scavenging gas seal of the present invention is formed by a scavenger. The scavenger is located in the optical path between the optical source surface and the optical target surface.

The scavenger apparatus includes a body, a central cavity, one or more gas supply bores, and one or more gas removal bores. The body defines first and second opposing surfaces. The first opposing surface is configured for positioning closely adjacent to the optical target surface. The second opposing surface is configured to mate with the optical source surface. The central cavity is formed in the body for passing light through the body, the central cavity being open at the first and second opposing surfaces. The one or more gas supply bores are formed in the body for supplying a flow of a purge gas to the central cavity. The one or more gas removal bores are formed in the body at the first opposing surface to remove gas from a gap formed between the first opposing surface and the optical target surface.

Further embodiments, features, and advantages of the present inventions, as well as the structure and operation of the various embodiments of the present invention, are described in detail below with reference to the accompanying drawings.

BRIEF DESCRIPTION OF THE FIGURES

In the drawings, like reference numbers generally indicate identical, functionally similar, and/or structurally similar elements. The drawing in which an element first appears is indicated by the left-most digit(s) in the corresponding reference number.

DETAILED DESCRIPTION OF THE PREFERRED EMBODIMENTS

Overview and Terminology

The present invention is directed to a method and apparatus for a non-contact scavenging gas seal. In a preferred embodiment, the non-contact scavenging gas seal of the present invention is formed by a scavenger in an optical path. The scavenger maintains a substantially oxygen-free purge gas environment in a portion of the optical path for the passage of oxygen-sensitive actinic radiation. The actinic radiation is transmitted by an illumination source, and passed along the optical path through a purge gas environment to a movable surface being exposed.

The present invention responds to actinic light transmission requirements and sensitivity to oxygen absorption in lithography systems, and to the need to remove contaminants from the exposure of photo-resist to actinic radiation. The present invention provides and maintains a purged atmosphere for oxygen-sensitive light transmission.

Furthermore, the present invention matches purged atmospheric pressure and ambient environmental air pressure.

The present invention may be used to maintain an environment purged of oxygen, or any other gas. Furthermore, the present invention is applicable to any type of purge gas used to fill a purge volume. The present invention may be used in any application requiring non-contact scavenging gas seals.

Further functions of the non-contact scavenging gas seal of the present invention include preventing the purge gas from escaping into the ambient atmosphere and preventing the ambient atmosphere from entering the purge volume.

To more clearly delineate the present invention, an effort is made throughout the specification to adhere to the following term definitions as consistently as possible.

"Ambient air" means an oxygen-containing atmosphere, such as normal atmospheric air, as found, for example, in a clean room environment.

"Purge gas" means a gas of controlled purity.

"Purge plate" a plate, made out of metal or other suitable material, used to extend the plane provided by a movable surface.

"Purge volume" means a volume or space that is purged of oxygen, or some other undesired gas.

Conventional Photolithography System

Figure 1:
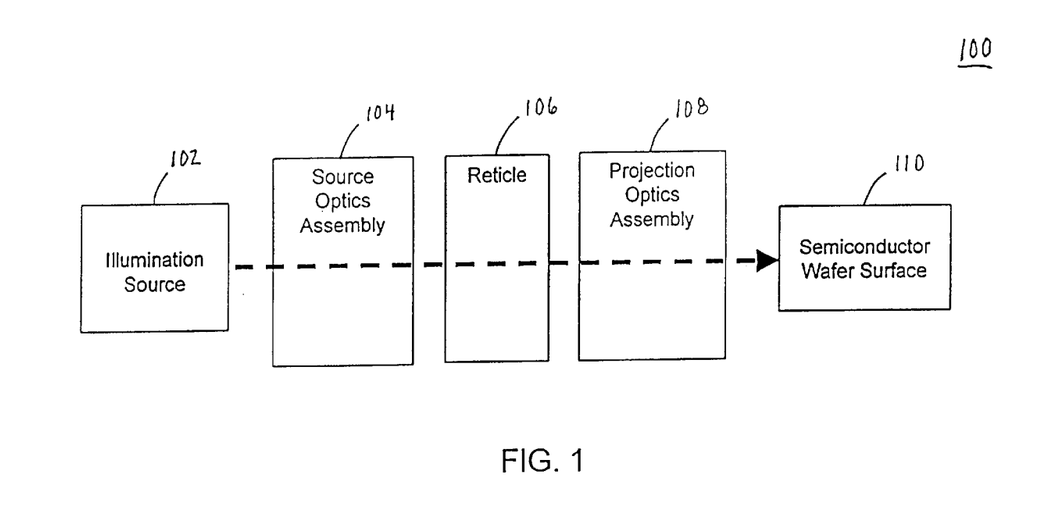
FIG. 1 illustrates a block diagram of a conventional lithography system.

FIG. 1 illustrates a conventional photolithography system 100. Conventional photolithography system 100 is located in an ambient air or gas environment.

Conventional photolithography system 100 comprises an illumination source 102, a source optics assembly 104, a reticle 106, a projection optics assembly 108, and a semiconductor wafer surface 110. Illumination source 102 includes a source of radiation for exposing semiconductor wafer surface 110. Source optics assembly 104 includes optics necessary to guide radiation from illumination source 102 to reticle 106. Reticle 106 includes a mask with a pattern that is to be transferred to semiconductor wafer surface 110 by radiation from illumination source 102. Projection optics assembly 108 includes the optics necessary to guide the radiation transmitted through the mask pattern of reticle 106 to semiconductor wafer surface 110. Semiconductor wafer surface 110 is the surface of a semiconductor wafer to be exposed and etched.

Illumination source 102 produces radiation 112. Radiation 112 is transmitted through source optics assembly 104, reticle 106, and projection optics assembly 108, to semiconductor wafer surface 110. Radiation 112 transmits through various ambient air gaps and channels in and between illumination source 102, source optics assembly 104, reticle 106, projection optics assembly 108, and semiconductor wafer surface 110. When radiation 112 includes light wavelengths that may be absorbed by oxygen, the oxygen in these ambient air gaps and channels of conventional photolithography system 100 may absorb them, preventing a sufficient amount of radiation from reaching semiconductor wafer surface 110. This may lead to an inadequate transfer of the pattern of reticle 106 to semiconductor wafer surface 110, and reduced semiconductor wafer yields.

Example Photolithography System of the Present Invention

Figure 2:
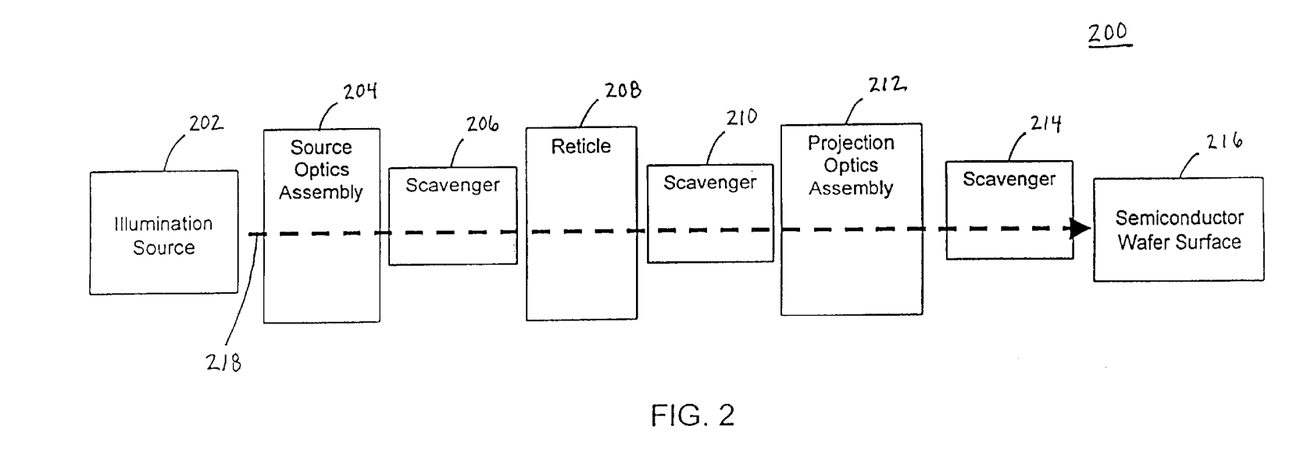
FIG. 2 illustrates an exemplary block diagram of a lithography system, according to an embodiment of the present invention.

FIG. 2 illustrates an exemplary photolithography system 200, according to an embodiment of the present invention. Photolithography system 200 is located in an ambient air environment. Photolithography system 200 maintains a purge gas environment for transmission of light wavelengths that are sensitive to passage through oxygen.

Photolithography system 200 comprises an illumination source 202, a source optics assembly 204, a first scavenger 206, a reticle 208, a second scavenger 210, a projection optics assembly 212, a third scavenger 214, and a semiconductor wafer surface 216.

Illumination source 202 includes a source of radiation for exposing semiconductor wafer surface 216. Illumination source 202 may include any applicable source of radiation suitable for exposing a semiconductor wafer surface, including a laser. Illumination source 202 transmits radiation 218. Radiation 218 may include any type of suitable radiation, including laser light. Radiation 218 may include oxygen-sensitive light wavelengths suitable for exposing and etching a semiconductor wafer. Such light wavelengths may include 157 nm wavelength light, for example.

Source optics assembly 204 is coupled to an output of illumination source 202. Radiation 218 is transmitted through source optics assembly 204. Source optics assembly 204 comprises a purge gas optical environment so that oxygen-sensitive wavelengths passing through are not degraded. Source optics assembly 204 includes optics necessary to condition and shape radiation 218 suitably to illuminate reticle 208.

A first surface of first scavenger 206 is coupled to an output surface of source optics assembly 204. Radiation 218 is transmitted through first scavenger 206 to reticle 208. First scavenger 206 helps maintain a purge gas environment so that oxygen-sensitive wavelengths passing through are not degraded.

Reticle 208 is coupled to an output surface of source optics assembly 204 through first scavenger 206. First scavenger 206 maintains this non-contacting purge gap, as further described below, between a second surface of first scavenger 206 and a first surface of reticle 208. Reticle 208 includes a mask with a pattern that is transferred to semiconductor wafer surface 216 by the process of photolithography. Reticle 208 may be coupled to a pellicle as well known in the relevant art. Reticle 208 maintains a purge gas environment so that oxygen-sensitive wavelengths passing through are not degraded. Reticle 208 may be moveable in relation to the second surface of first scavenger 206 so that different areas of the mask may be moved into the path of radiation 218. Radiation 218 is transmitted through reticle 208 to second scavenger 210.

Reticle 208 is coupled to an input surface of projection optics assembly 212 through second scavenger 210. Second scavenger 210 maintains a non-contacting purge gap, as further described below, between a second surface of second scavenger 210 and a second surface of reticle 208. Reticle 208 may be moveable in relation to the second surface of second scavenger 210 so that different areas of the mask may be moved into the path of radiation 218. Radiation 218 is transmitted through second scavenger 210 to projection optics assembly 212. Second scavenger 210 helps maintain a purge gas environment so that oxygen-sensitive wavelengths passing through are not degraded.

Projection optics assembly 212 is coupled to a first surface of second scavenger 210. Projection optics assembly 212 maintains a purge gas environment so that oxygen-sensitive wavelengths passing through are not degraded. Projection optics assembly 212 includes optics necessary to guide radiation 218 received from reticle 208 to semiconductor wafer surface 216.

A first surface of third scavenger 214 is coupled to an output of projection optics assembly 212. Radiation 218 is transmitted through third scavenger 214 to semiconductor wafer surface 216. Third scavenger 214 helps maintain a purge gas environment so that oxygen-sensitive wavelengths passing through are not degraded.

Semiconductor wafer surface 216 is coupled to an output of projection optics assembly 212 through third scavenger 214. Third scavenger 214 maintains a non-contacting purge gap, as further described below, between a second surface of third scavenger 214 and semiconductor wafer surface 216. Semiconductor wafer surface 216 may be moveable in relation to the second surface of third scavenger 214 so that different areas of the wafer surface may be moved into the path of radiation 218. Semiconductor wafer surface 216 comprises a surface to be exposed by radiation 218 transmitted by illumination source 218.

Lithography system 200 provides a purge gas optical path for radiation 218 from illumination source 202, through source optics assembly 204, reticle 208, and projection optics assembly 212, to semiconductor wafer surface 216. Hence, illumination source 202 may transmit oxygen-sensitive light wavelengths, without suffering from significant attenuation caused by oxygen absorption.

Three scavengers are shown in the embodiment of FIG. 2. Additional or fewer scavengers of the present invention may be used in other embodiments, as is required by the application. Furthermore, each scavenger may be adapted to its particular application, as would be understood to persons skilled in the relevant art(s) from the teachings herein.

The non-contact scavenging gas seal of the present invention is described above in an example photolithography environment. The present invention is not limited to such an environment, and is applicable to additional photolithography environments, and non-photolithography environments. The example is presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Non-Contact Scavenging Gas Seal of the Present Invention

Preferred embodiments for a non-contact scavenging gas seal according to the present invention are described below. The present invention is adaptable to any application requiring non-contact scavenging gas seals.

Figure 3:
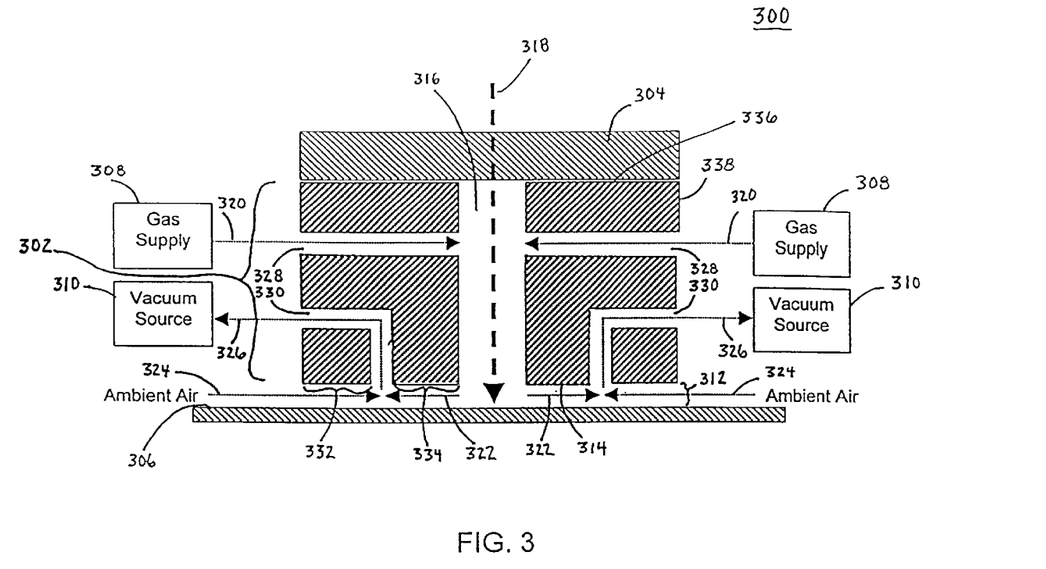
FIG. 3 illustrates a cross-sectional view of an exemplary non-contact scavenging gas seal, according to an embodiment of the present invention.

FIG. 3 illustrates a cross-sectional view of an exemplary non-contact scavenging gas seal 300, according to an embodiment of the present invention. Non-contact scavenging gas seal 300 comprises a scavenger 302, an optical source surface 304, a movable surface 306, a gas supply 308, and a vacuum source 310.

Scavenger 302 maintains a non-contact purge gas seal across a purge gap 312 between a first opposing surface 314 of scavenger 302 and movable surface 306. In an embodiment, scavenger 302 provides a purged optical path between an optical source surface and an optical target surface in a lithography system, and permits relative movement between the optical source surface and the optical target surface. Scavenger 302 comprises a purge volume 316, at least one gas supply bore 328, at least one vacuum bore 330, and a body 338.

Body 338 comprises first opposing surface 314 and a second opposing surface 336. First opposing surface 314 is configured to be positioned closely adjacent to movable surface 306. Second opposing surface 336 is configured to mate with optical source surface 304. In an embodiment, first opposing surface 314 and second opposing surface 336 are substantially parallel to one another.

Purge volume 316 is preferably a cavity formed centrally in body 338 for passing light through scavenger 302. Purge volume 316 is open at first and second opposing surfaces 314 and 336. In a preferred embodiment, actinic radiation 318 produced by an illumination source is transmitted through optical source surface 304 and purge volume 316 to movable surface 306. In alternative embodiments, actinic radiation 318 produced by an illumination source is transmitted in the opposite direction through movable surface 306 and purge volume 316 to optical source surface 304. The purge gas in purge volume 316 is substantially free of oxygen, and hence does not substantially degrade actinic radiation 318. The invention maintains a purge gas environment in purge volume 316 by passively matching the pressure of purge gas within purge volume 316 with that of the ambient environment outside of scavenger 302.

Optical source surface 304 is an optical interface or element in an optical path leading up to or from scavenger 302. Optical source surface 304 seals an opening to purge volume 316 at second opposing surface 336. Optical source surface 304 may be any optical element or optical element support structure. For example, optical source surface 304 may be a plain piece of glass, a flat lens, a lens element with curvature, and/or other optical element or interface known to persons skilled in the relevant art(s).

Movable surface 306 is a substantially planar surface that is movable relative to first opposing surface 314 of body 338. For example, movable surface 306 may be a surface of a reticle or a semiconductor wafer, or other optical target surface. Other suitable movable surfaces will be known to persons skilled in the relevant art(s) from the teachings herein.

Gas supply 308 supplies a flow of purge gas into the central cavity of purge volume 316. The purge gas entering purge volume 316 is shown as purge gas flow 320. Purge gas flow 320 passes into scavenger 302 through one or more gas flow ports or bores in body 338, shown as gas flow bores 328. Gas supply 308 provides pressure gradients. Suitable gas supply systems for gas supply 308 are well known in the art.

Vacuum system 310 removes purge gas and ambient environment gas from purge gap 312. Purge gas being removed from purge gap 312 is shown as purge gas flow 322. Ambient environment gas being removed from purge gap 312 is shown as ambient environment gas flow 324. The combination of purge gas flow 322 and ambient environment gas flow 324 is shown as gas flow 326. Gas flow 326 is removed from purge gap 312 through one or more gas removal bores or ports formed in body 338 at first opposing surface 314, shown as vacuum bores 330. The pressure gradients supplied by gas supply 308 are supported by a vacuum driven exhaust of vacuum system 310. Vacuum system 310 prevents both purge gas and ambient environmental gas from leaving the controlled area of purge gap 312 through any route other than vacuum bore 330. Suitable vacuum systems for use as vacuum system 310 are well known in the art.

The gas flow dynamics of the invention assure that for properly specified flow rates, the gas purity in purge volume 316 will be governed most significantly by gas supply 308. In addition, the kinetic energy of gas flow in purge volume 316 and purge gap 312 serves to remove contaminants born from actinic exposure of semiconductor wafer photo-resist. Furthermore, insensitivity to surface discontinuities is aided by the mass flow driven velocity in purge gap 312.

In a preferred embodiment, purge gap 312 may have a length or height in the range of 0.002 inches to 0.02 inches between first opposing surface 314 and movable surface 306. However, the present invention is not limited to this range, but is adaptable to other purge gap ranges, as would be known to persons skilled in the relevant art(s) from the teachings herein.

Furthermore, purge gap 312 is not required to be uniform throughout, but may be non-uniform. For instance, movable surface 306 may be at a slight angle from parallel to first opposing surface 314, as long as the distances between movable surface 306 and first opposing surface 314 remain within a designated acceptable range, such as the example range given above.

Figure 4:
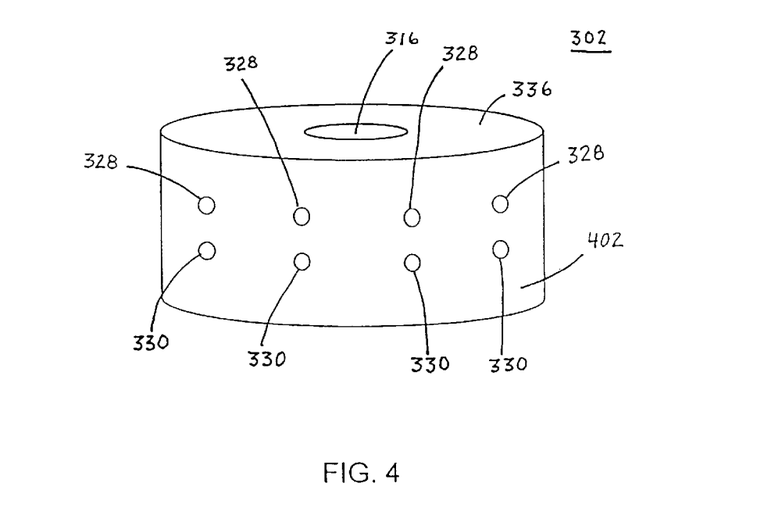
FIG. 4 illustrates a perspective view of an exemplary scavenger, according to an embodiment of the present invention.

Body 338 may be shaped in any number of different ways, including round or cylindrical, elliptical, square, rectangular, irregular, and other shapes. FIG. 4 illustrates a perspective view of an exemplary round or cylindrical scavenger 302, according to an embodiment of the present invention. FIG. 4 shows second opposing surface 336 and purge volume 316 of scavenger 302.

Purge gas may be inserted at one or more locations on an outer surface of a scavenger, depending on how the gas flow inside of the purge volume is to be defined for a particular application. Any number of gas flow bores or ports for inserting purge gas may be used. FIG. 4 shows exemplary gas flow bores 328 on an outer surface 402 of scavenger 302. In a preferred embodiment, the gas supply bores or ports are equally spaced around the scavenger. In an embodiment, the gas supply bores or ports open to purge volume 316 adjacent to second opposing surface 338.

The pressure of purge volume 316 relative to the ambient environment pressure may be controlled by varying dimensions of scavenger 302. FIG. 3 shows a first distance 332 and a second distance 334. By varying first distance 332 and second distance 334 relative to one another, the "gauge" pressure, or the pressure within purge volume 316 relative to the ambient environmental pressure, may be varied. First distance 332 and second distance 334 are analogous to "conductance paths" in fluid dynamics. By matching first distance 332 and second distance 334, the pressure in purge volume 316 and the ambient environmental pressure can be matched. By having first distance 332 longer relative to second distance 334, the pressure in purge volume 316 can be lowered relative to the ambient environmental pressure. By having first distance 332 shorter relative to second distance 334, the pressure in purge volume 316 can be raised relative to the ambient environmental pressure.

For example, in a cylindrical scavenger embodiment, vacuum port 330 on first opposing surface 314 would be located radially closer to purge volume 316 than to an outer edge of body 338 to provide a pressure within purge volume 316 that is lower than a pressure external to body 338. Likewise, vacuum port 330 on first opposing surface 314 would be located radially closer to an outer edge of body 338 than to purge volume 316 to provide a pressure within purge volume 316 that is higher than a pressure external to body 338.

Exemplary embodiments of a non-contact scavenging gas seal of the present invention are described above. The present invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the present invention.

Non-Contact Scavenging Gas Seal Embodiment with Purge Plate

Figure 5:
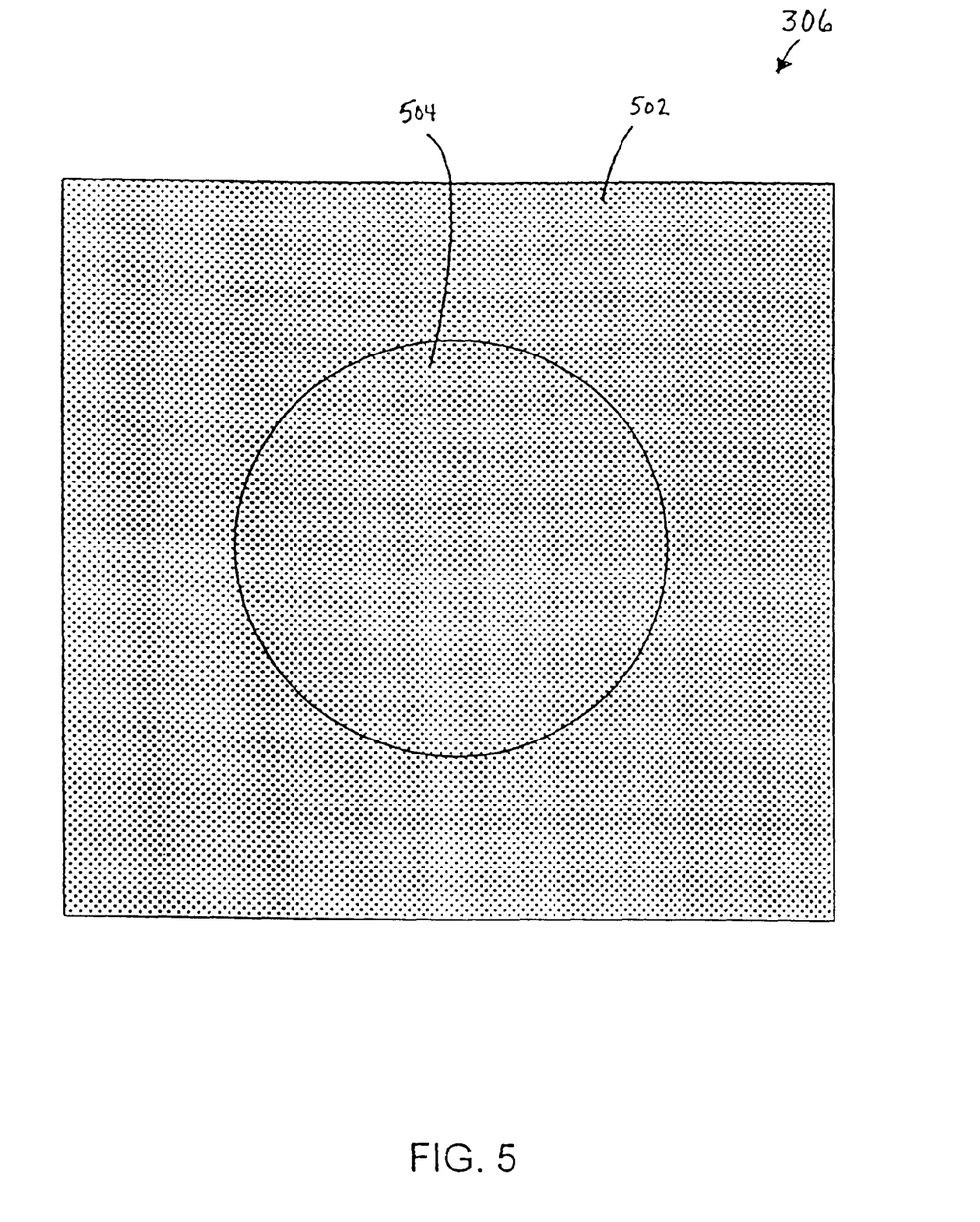
FIG. 5 illustrates an exemplary movable surface, according to an embodiment of the present invention.

Embodiments of the present invention may further comprise a purge plate. FIG. 5 illustrates an exemplary movable surface 306, which comprises purge plate 502 and a semiconductor wafer surface 504.

Purge plate 502 and semiconductor wafer surface 504 are co-planar. Purge plate 502 may be used to extend the surface of movable surface 306. For instance, purge plate 502 may be used to extend the area or plane of semiconductor wafer surface 504 such that a seal may be maintained between movable surface 306 and a scavenger all the way to the edges of the wafer surface. Purge plate 502 accounts for the non-negligible diameter of scavenger 302, which needs a surface adjacent to it to maintain a gas seal. Purge plate 502 allows scavenger 302 to move to the edge of semiconductor wafer surface 502 (or other surface) without degrading the gas seal. Purge plate 502 may also be used to extend the area or plane of a reticle surface, or other applicable surface.

In the example movable surface 306 shown in FIG. 5, purge plate 502 surrounds the edges of semiconductor wafer surface 504, extending the plane of the wafer radially in all directions. Semiconductor wafer surface 504 is substantially round, with a diameter. Purge plate 502 has a substantially round opening within, with a diameter substantially equal to that of semiconductor wafer surface 504, such that semiconductor wafer surface 504 fits within.

Purge plate 502 may be of any substantially planar shape, including round, elliptical, square, rectangular, irregular, or any other shape, as is necessary in the particular application. Purge plate 502 is adaptable to any size of semiconductor wafer or reticle, or other surface.

Non-Contact Scavenging Gas Seal Embodiment with Internal Accumulator

Figure 6:
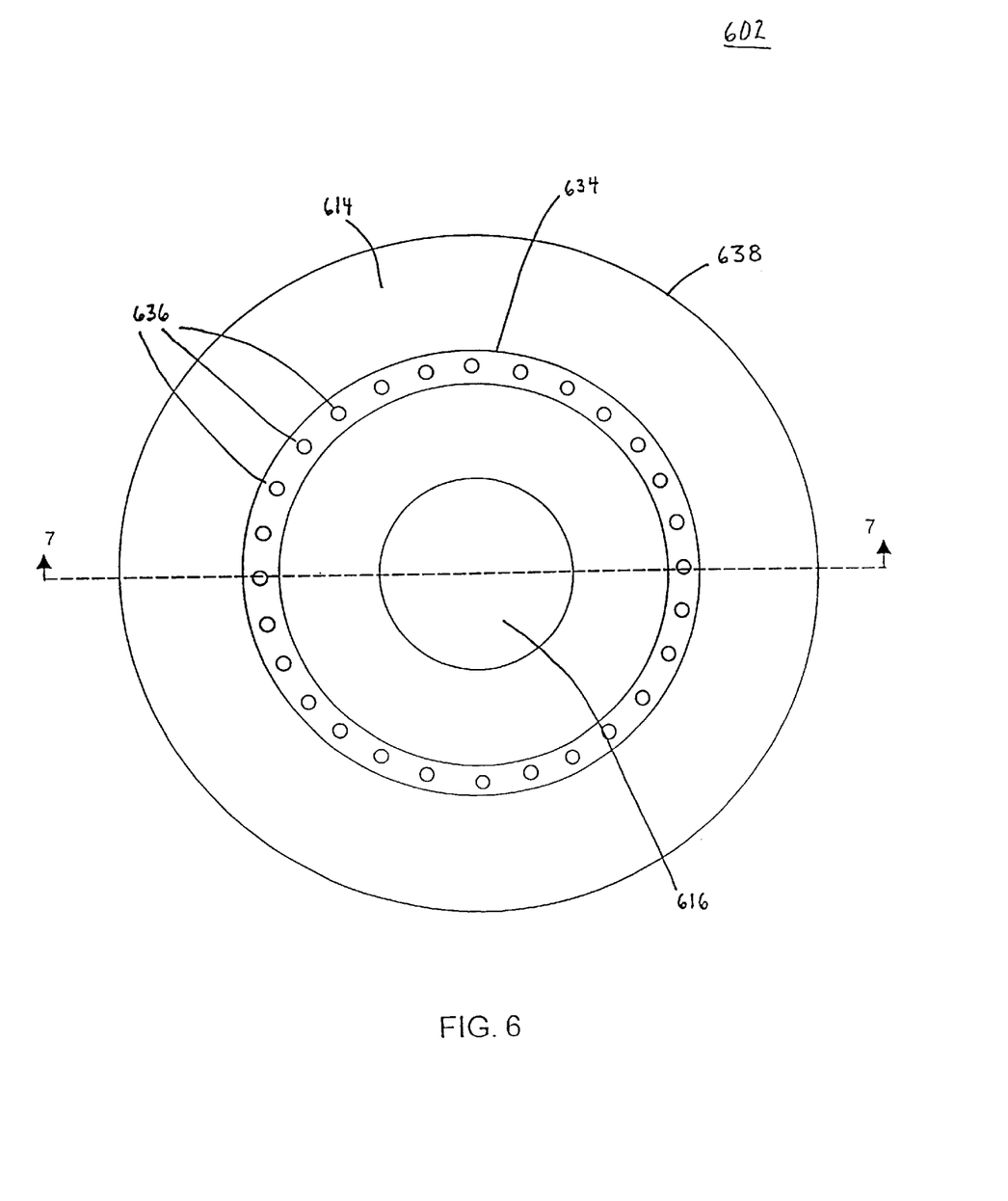
FIG. 6 illustrates a bottom view of an exemplary scavenger, according to an embodiment of the present invention.
Figure 7:
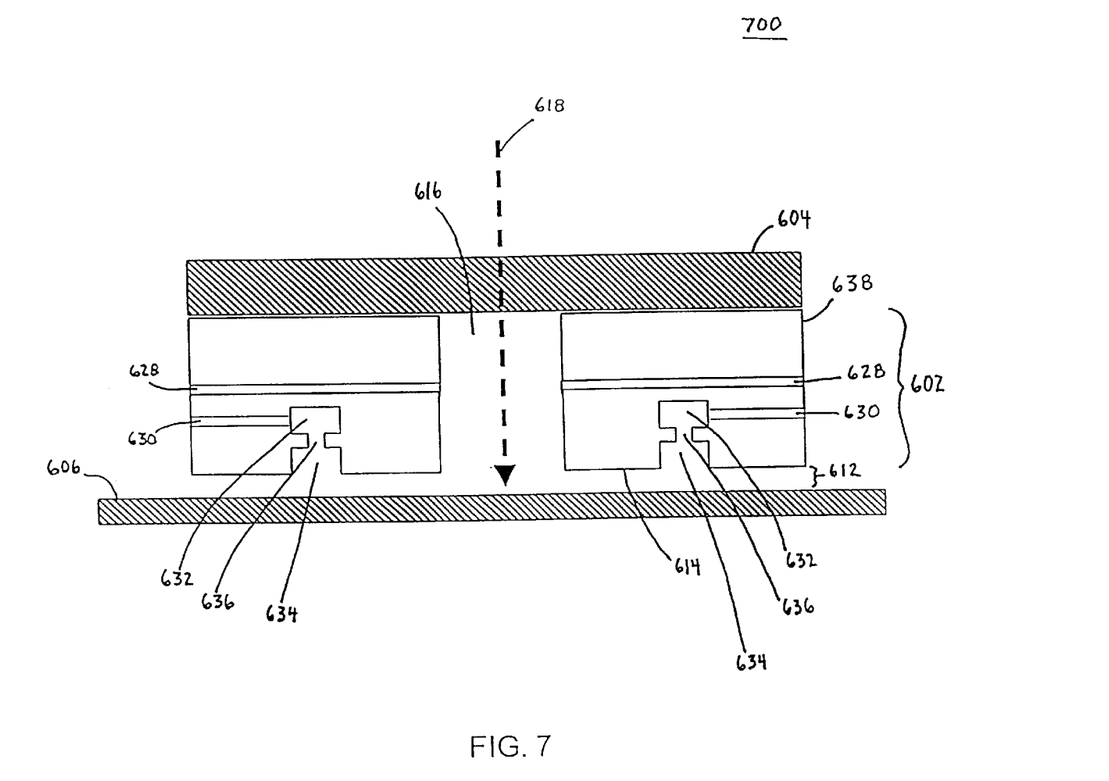
FIG. 7 illustrates a cross-sectional view of a non-contact scavenging gas seal, incorporating the exemplary scavenger of FIG. 6.

Various embodiments according to the present invention may provide different gas flow and pressure arrangements. FIG. 6 illustrates a bottom view of an exemplary scavenger 602, according to an alternate embodiment of the present invention. FIG. 7 illustrates a cross-sectional view of exemplary non-contact scavenging gas seal 700 incorporating scavenger 602 of FIG. 6. Non-contact scavenging gas seal 700 is configured similarly and operates similarly to non-contact scavenging gas seal 300 of FIG. 3. Non-contact scavenging gas seal 700 comprises a scavenger 602, an optical source surface 604, and a movable surface 606, as shown in FIG. 7.

As shown in FIG. 7, scavenger 602 maintains a gas seal in a purge gap 612 between a first opposing surface 614 of scavenger 602 and movable surface 606. Scavenger 602 comprises a purge volume 616, at least one gas supply bore 628, at least one vacuum bore 630, an accumulator 632, a vacuum channel 636, at least one accumulator bore 636, and a body 638.

Purge volume 616 is preferably a bore formed centrally in body 638 for passing light through scavenger 602. As in the discussion above, a gas supply inserts a purge gas into purge volume 616 through at least one gas supply bore 628 in body 638. A vacuum source removes the purge gas and ambient environment gas leaking into purge gap 612, to maintain the gas seal. An illumination source transmits a radiation 618 through purge volume 616 to movable surface 606.

Accumulator 632 is located in body 638. Accumulator 632 is a cavity connecting at least one vacuum bore 630 in body 638. In an embodiment where body 638 is cylindrical, accumulator 632 is a circular channel inside body 638. Accumulator 632 aides in causing the vacuum pressure in purge gap 612 to become more uniform and constant. Further configurations for accumulator 632 are within the scope and spirit of the present invention.

Vacuum channel 634 is located in body 638. Vacuum channel 634 is coupled to accumulator 632 by at least one accumulator bore 636. Purge gas and ambient environment gas flow from purge gap 612 through vacuum channel 634, at least one accumulator bore 636, accumulator 632, and at least one vacuum bore 630 to the vacuum source. Vacuum channel 634 also aides in causing the pressure in purge gap 612 to become more uniform and constant. In an embodiment where scavenger 602 is substantially cylindrical, vacuum channel 634 is a circular channel in first opposing surface 614 of body 638.

Further embodiments for varying gas flows and pressures, as would be recognized by persons skilled in the relevant art(s) from the teachings herein, are within the scope and spirit of the present invention.

Operation of the Present Invention

Exemplary operational and/or structural implementations related to the structure(s), and/or embodiments described above are presented in this section. These components and methods are presented herein for purposes of illustration, and not limitation. The invention is not limited to the particular examples of components and methods described herein. Alternatives (including equivalents, extensions, variations, deviations, etc., of those described herein) will be apparent to persons skilled in the relevant art(s) based on the teachings contained herein. Such alternatives fall within the scope and spirit of the present invention.

Figure 8:
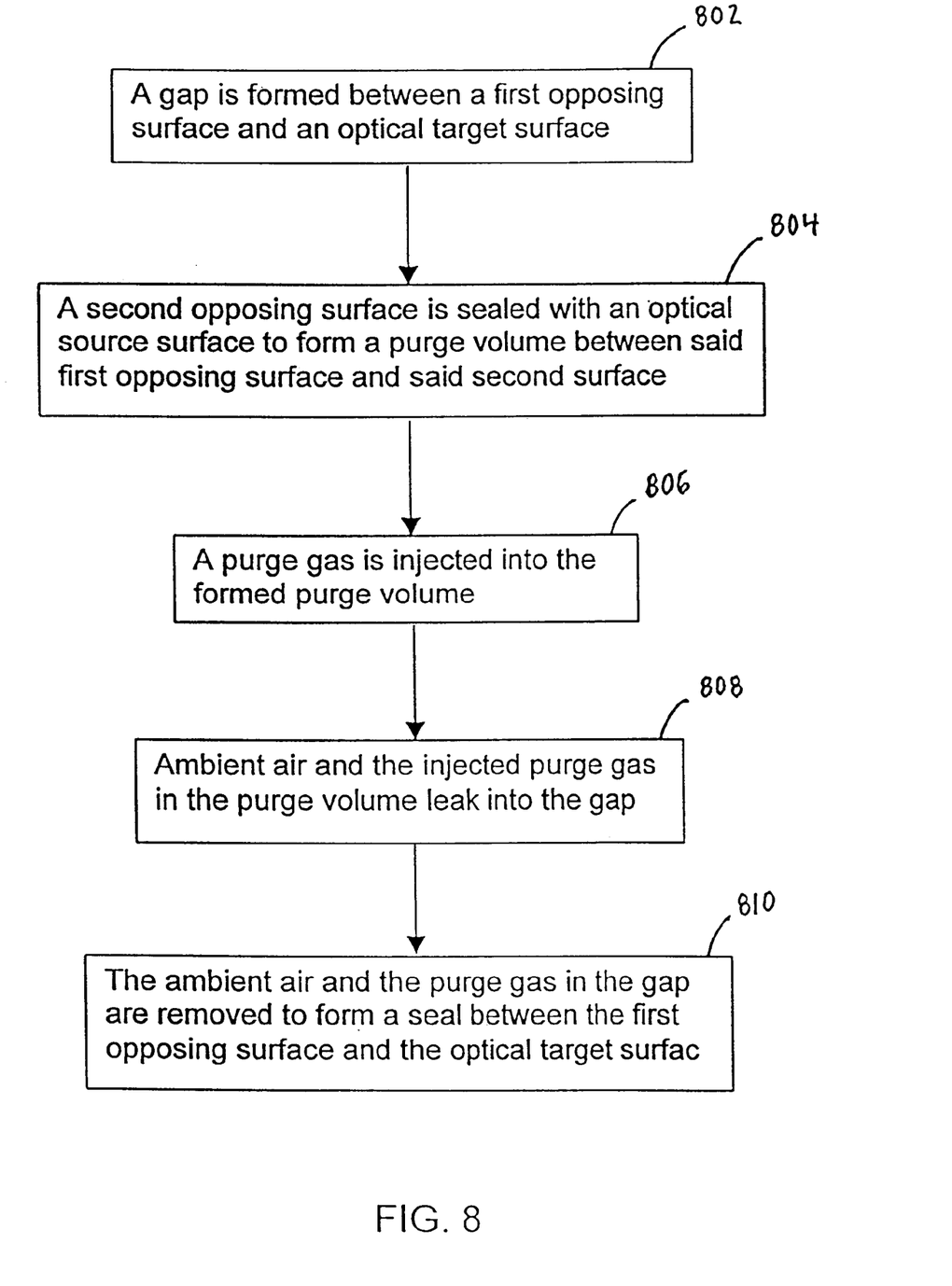
FIG. 8 shows a flowchart providing detailed operational steps of an example embodiment of the present invention.

FIG. 8 shows a flowchart providing detailed operational steps of an example embodiment of the present invention. The steps of FIG. 8 do not necessarily have to occur in the order shown, as will be apparent to persons skilled in the relevant art(s) based on the teachings herein. Other structural embodiments will be apparent to persons skilled in the relevant art(s) based on the discussion contained herein. These steps are described in detail below.

The process illustrated in FIG. 8 presents a method for providing a purged optical path between an optical source surface and an optical target surface, and for permitting relative movement between the optical source surface and the optical target surface.

The process begins with step 802. In step 802, a gap is formed between a first opposing surface and an optical target surface. In step 804, a second opposing surface is sealed with an optical source surface to form a purge volume between said first opposing surface and said second surface. In step 806, a purge gas is injected into the formed purge volume. In step 808, ambient air and the injected purge gas in the purge volume leak into the gap. In step 810, the ambient air and the purge gas in the gap are removed to form a seal between the first opposing surface and the optical target surface.

Step 810 may include a step where the removed ambient air and purge gas are accumulated. For instance, the removed ambient air and purge gas may be accumulated in an accumulator internal to the scavenger.

Step 810 may include a step where the ambient air and the purge gas in the gap are removed through at least one vacuum port in the first opposing surface to form a seal between the first opposing surface and the optical target surface.

The process shown in FIG. 8 may include the further step where a distance of the first opposing surface radially outside the at least one vacuum port is modified to adjust a pressure within the purge volume.

The process shown in FIG. 8 may include the further step where a distance of the first opposing surface radially inside the at least one vacuum port is modified to adjust a pressure within the purge volume.

The process shown in FIG. 8 may include the further step where the optical target surface is moved relative to the first opposing surface.

The process shown in FIG. 8 may include the further step where a surface plane of the optical target surface is extended.

Additional steps or enhancements to the above steps known to persons skilled in the relevant art(s) from the teachings herein are also encompassed by the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An apparatus for providing an optical path purged of undesirable gas between an optical source surface and an optical target surface and for permitting relative movement between the optical source surface and the optical target surface, the apparatus comprising:

a body defining first and second opposing surfaces, said first opposing surface being configured for positioning closely adjacent to the optical target surface and said second opposing surface being configured to mate with the optical source surface;

a central cavity formed in said body for passing light through said body, and said central cavity being open at said first and second opposing surfaces;

at least one gas supply bore formed in said body to supply a flow of a purge gas to said central cavity; and at least one gas removal bore formed in said body at said first opposing surface to remove said purge gas and the undesirable gas from said central cavity and from a gap that is in the range of 0.002 to 0.02 inches formed between said first opposing surface and said optical target source.

2. The apparatus of claim 1, wherein said optical target surface is a reticle surface, a pellicle surface, or a semiconductor wafer surface.

3. The apparatus of claim 1, further comprising a purge plate that surrounds and is co-planar with said optical target surface.

4. The apparatus of claim 1, comprising a plurality of gas removal bores, wherein said body further comprises an accumulator internal to said body, wherein said accumulator interconnects said plurality of gas removal bores.

5. The apparatus of claim 1, wherein said body is substantially cylindrical in shape.

6. The apparatus of claim 1, wherein said at least one gas supply bore opens to said central cavity adjacent said second opposing surface.

7. The apparatus of claim 1, wherein said opposing first surface and said opposing second surface are substantially parallel.

8. The apparatus of claim 1, where said at least one gas removal bore on said first opposing surface is radially closer to said central cavity than to an outer edge of said body to provide a pressure within said central cavity that is lower than a pressure external to said body.

9. The apparatus of claim 1, wherein said at least one gas removal bore on said first opposing surface is radially closer to an outer edge of said body than to said central cavity to provide a pressure within said central cavity that is greater than a pressure external to said body.

10. An apparatus for providing an optical path purged of undesirable gas between an optical source surface and an optical target surface and for permitting relative movement between the optical source surface and the optical target surface, the apparatus comprising:

a body defining first and second opposing surfaces, said first opposing surface being configured for positioning closely adjacent to the optical target surface and said second opposing surface being configured to mate with the optical source surface;

a central cavity formed in said body for passing light through said body, and said central cavity being open at said first and second opposing surfaces;

at least one gas supply bore formed in said body along said central cavity to supply a flow of a purge gas to said central cavity; and at least one gas removal bore formed in said body at said first opposing surface to remove said purge gas and the undesirable gas from said central cavity and from a gap formed between said first opposing surface and said optical target source.

11. The apparatus of claim 10, further comprising a purge plate that surrounds and is co-planar with said optical target surface.

12. The apparatus of claim 10, wherein said at least one gas removal bore on said first opposing surface is radially closer to said central cavity than to an outer edge of said body to provide a pressure within said central cavity that is lower than a pressure external to said body.

13. The apparatus of claim 10, wherein said at least one gas removal bore on said first opposing surface is radially closer to an outer edge of said body than to said central cavity to provide a pressure within said central cavity that is greater than a pressure external to said body.

* * * * *